United States Patent [19]

Bhatia et al.

[11] 4,426,655
[45] Jan. 17, 1984

[54] MEMORY CELL RESISTOR DEVICE

[75] Inventors: Harsaran S. Bhatia, Wappingers Falls; David B. Eardley, Stanfordville; Santosh P. Gaur, Wappingers Falls, all of N.Y.

[73] Assignee: International Business Machines Corporation, Armonk, N.Y.

[21] Appl. No.: 293,413

[22] Filed: Aug. 14, 1981

[51] Int. Cl.³ .................... H01L 29/74; H01L 29/48
[52] U.S. Cl. ................................ 357/21; 357/15; 357/89
[58] Field of Search .................. 357/21, 22, 89, 15

[56] References Cited

U.S. PATENT DOCUMENTS 3,868,718  2/1975  Arai ............................. 357/22
4,328,511  5/1982  Tasch et al. ................... 357/41

OTHER PUBLICATIONS

Arai "Charge-Storage Junction Field-Effect Transistor" IEEE Trans. Electron Devices, vol. Ed-22 (4/75) pp. 181-185.

*Primary Examiner*—Gene M. Munson
*Attorney, Agent, or Firm*—Sughrue, Mion, Zinn, Macpeak and Seas

[57] ABSTRACT

A dynamic memory cell uses a low barrier Schottky contact at a drain region to eliminate the need for an external gating diode. The drain is separated from source and injector regions by a heavily doped N+ reach through region extending to a heavily doped N+ blanket semiconductor. Holes injected into one of the separated regions are trapped by high-low junctions and are detected by sensing the source-drain current.

12 Claims, 4 Drawing Figures

MEMORY CELL RESISTOR DEVICE

BACKGROUND OF THE INVENTION

1. Field of the Invention

This invention relates to a dynamic storage device utilizing the concept of trapping minority carriers for data storage.

2. Prior Art

This invention is related to a copending application entitled "High Density Memory Cell" filed on the same date as this application by Narasipur G. Anantha et al and commonly assigned with this application. This copending application discloses a dynamic storage device having a high-low junction of N-type silicon with a P-type injector region separating source and drain regions. This invention is an improvement of the invention defined in that copending application.

The prior art identified in the copending application, namely U.S. Pat. Nos. 3,852,800, 4,122,543, and 4,164,751 shows various charge storage concepts. In particular, the prior art utilizes MIS capacitors, PN junction capacitance, and depletion layer capacitance. The prior art does not show high-low-high junction trapping of minority carriers used for data storage.

While the copending application represents a significant improvement over that prior art, it requires an external diode as the gating device for each cell when forming the two dimensional storage array. The requirement of the additional diode decreases the ability to achieve extremely high packing densities, a standing requirement in this technology. Accordingly, the elimination of external elements used to form a storage array represents potentially a significant improvement in achieving high packing densities.

Moreover, prior art dynamic memories require thin film dielectrics that are difficult to manufacture. In the case of charge storage on P+/N+ junction capacitance, leakage due to tunneling requires the data to be refreshed more frequently. A large number of masks are generally required in the formation of those devices and while the processing steps per se are well established in the art, cost and yield considerations remain as areas requiring improved process steps.

SUMMARY OF THE INVENTION

Given the requirements of achieving higher packing densities in dynamic memory arrays, it is an object of this invention to define an improved memory circuit eliminating the requirement of external diodes for each memory cell.

A further object of this invention is to provide a dynamic memory array having low power dissipation and capable of being manufactured utilizing simple processing techniques.

Another object of this invention is to define a dynamic memory device utilizing processing compatible with bipolar device processing but utilizing a reduced number of masks.

Yet another object of this invention is to define a dynamic memory device utilizing the concept of trapping injected minority carriers for data storage.

An important object of this invention is the incorporation of the gating member as an integral element of the device. A low barrier Schottky diode is formed at the drain region to perform the gating function and thereby eliminate a potential external circuit element.

In accordance with the present invention, a single device dynamic semiconductor memory is formed having a P-type conductivity injector region with high-low-high junctions of N-type conductivity disposed below the injector region. Those junctions trap injected minority charges which are detected by sensing the current flow from a source region to a drain region which are located on opposite sides of the injector region. The source and injector regions utilize ohmic contact while the low barrier Schottky contact is made to the drain region. In order to provide separation between the depletion region of the Schottky contact in the injector region, a heavily doped N region is provided.

This invention will be explained in greater detail by referring to the attached drawings and the description of the preferred embodiment which follows.

DESCRIPTION OF THE PREFERRED EMBODIMENT

Figure 1:
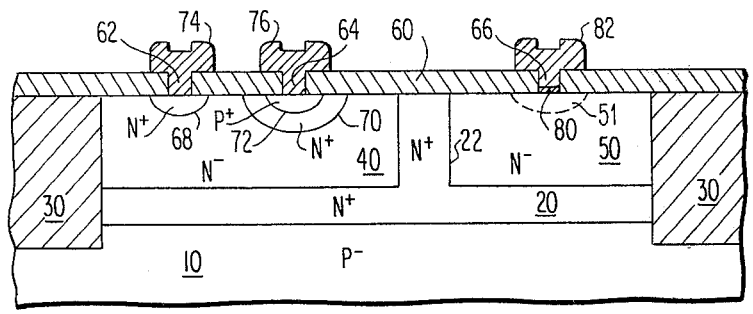
FIG. 1 is a schematic side view showing a single cell of the bipolar dynamic memory in accordance with this invention.

Referring now to FIG. 1, a cross section view of one cell of the dynamic memory array in accordance with this invention is depicted.

The substrate, typically a silicon of the P-type 10 is formed having a resistivity in the range of 10–20 $\Omega$-cm. On top of the substrate 10, a blanket semiconductor 20 of a N+ type is formed, and an epitaxial N$^-$ layer grown over this. This layer is subsequently divided into regions 40 and 50. The N+ type region 20 is bounded on both sides of the cells by an oxide filled trench 30 to achieve deep dielectric isolation of the cells. Deep dielectric isolation is achieved by techniques known in the art.

A thin oxide layer, 400–500 Å is thermally grown over the N$^-$ epitaxial layer. A photoresist mask is used to open the area corresponding to region 22. By ion implantation of phosphorous the N+ region 22 is formed. The photoresist is then removed and the SiO$_2$ layer 60 is deposited. Typical thickness of the layer 60 is in the range of 3000 Å. The region 22 separates the N$^-$ epitaxial region into two sections 40 and 50. The SiO$_2$ oxide layer 60 formed on the top surface has openings 62, 64, and 66 to allow contact to the N$^-$ epi. Opening 62 defines the source region having an N+ implantation layer 68 beneath the opening. At the injector region, beneath opening 64, an N+ region 70 surrounds a P+ implant 72. Metal lines 74, 76 are evaporated above the source and injector regions. The N+ regions may be phosorous or arsenic implants, while the P+ region is a boron implant.

The present invention departs from the above-referenced copending application by the use of the N+ separating or reach through region 22, and the elimination of the N+ region in the epi 50 beneath the drain area. In place of the N+ region beneath the drain, the present invention utilizes a low barrier Schottky Barrier Diode (SBD) 80 at the drain opening 66 in contact with the N$^-$ epi 50. A metal line 82 is evaporated over the SBD to form the drain contact. The low barrier Schottky Diode is formed using titanium, tungsten, an alloy of titanium and tungsten, chromium, tantalum or other metals having a barrier height on N− type silicon of less than about 0.55 electron volt.

Metalization of source, injector and drain coupling common points in an array is accomplished using known techniques. The metal line coupling source region runs in the X-direction while injector and drain lines run orthogonal, in the Y-direction. A stud or raised portion of source terminals typically provided the height differential to allow the lines to cross without contact, it being understood that an insulator would also be employed between metalization layers.

As shown in FIG. 1, ohmic contact is made to the source and injector regions. However, a Schottky contact is made to the drain region by means of SBD 80. Additionally, the heavily doped N+ region 22 separates trapped charges in the N− epi 40 from the depletion region 51 of the Schottky contact. The region 22 prevents the SBD 80 from removing stored charge in the N− epi 40. This structure eliminates the requirement for an external diode for each cell when forming a two-dimensional array.

Figure 2:
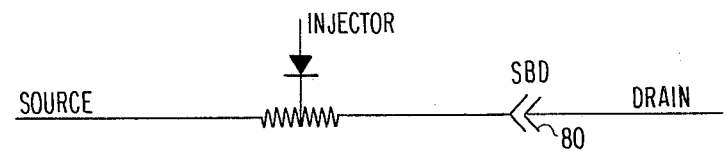
FIG. 2 is an equivalent circuit of the device shown in FIG. 1.

FIG. 2 shows the equivalent circuit of a single cell, defining a unijunction transistor. The operation of the equivalent circuit in FIG. 2 as a function of charge and current flow in the FIG. 1 single cell will now be described with respect to the operation of a composite memory forming a two-dimensional array.

Figure 3:
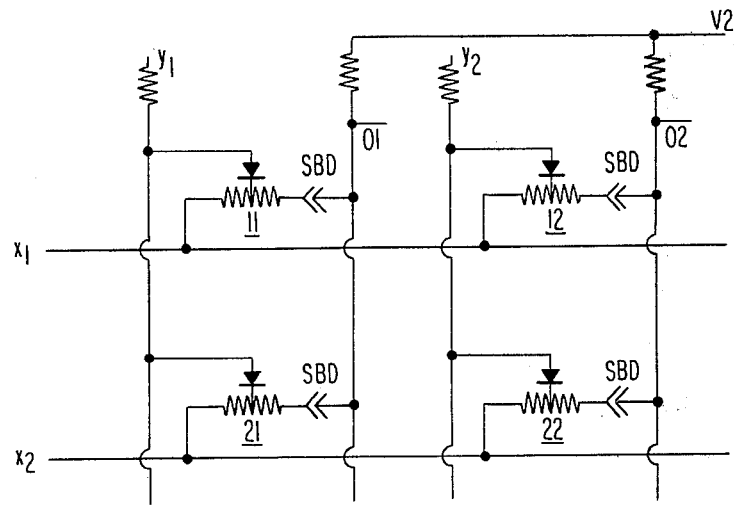
FIG. 3 is a circuit diagram of a 2×2 memory array.

FIG. 3 shows a sample memory array comprising four unijunction transistor elements each comprising a single memory cell. The array is denoted utilizing conventional identifying formats with the horizontal lines denoted by the first digit and the vertical columns denoted by the second digit. Accordingly, the cell 11 is the first cell in the first column of the first row. Cell 12 is the second cell in the first row while cell 21 is the first cell in the second row. In actual practice a typical array will be much larger, for example 64K bits.

The operation of the single cell shown in FIG. 1 is similar to that described in the above-referenced copending application. If the P+ injector region 72 and the N+ source region 68 are held at ground potential, and the Schottky Barrier Diode 80 is forward biased with respect to the source, a small current will flow between the source and drain due to the high resistance in the N− region 40. If the P+ injector region 72 is forward biased with respect to the source region 68, holes are injected from the P+ region 72 to the N− epi 40. However, the existence of the N+ reach through region 22 prevents the loss of such stored charge. Two high-low junctions exist at the interface between N+ region 68 and N− epi 40, and N+ region 70 and the N− epi 40. A third high-low junction exists between the N+ region 20 and the N− region 40. The electric field existing at those junctions tends to oppose hole movement into the N+ regions. Therefore, the injected holes from the injector region 72 will be stored in the N− epi 40.

If the P+ injector region 72 is held at ground potential and the drain region 80 having the low barrier SBD is biased with respect to the source 68, also held at ground potential, the low barrier Schottky will not inject minority carriers. However, due to the bias which exists between the SBD and the source 68, a large current will initially flow from between the source region 68 and the drain region 80 due to holes stored in the N− epi 40. As the current flows through the device, the stored charge is removed, the resistance becomes high and the current decays to a low level. The increase in current is sensed so that the presence or absence of stored holes in the N− region can be used to determine binary one or binary zero values for a memory cell.

Figure 4:
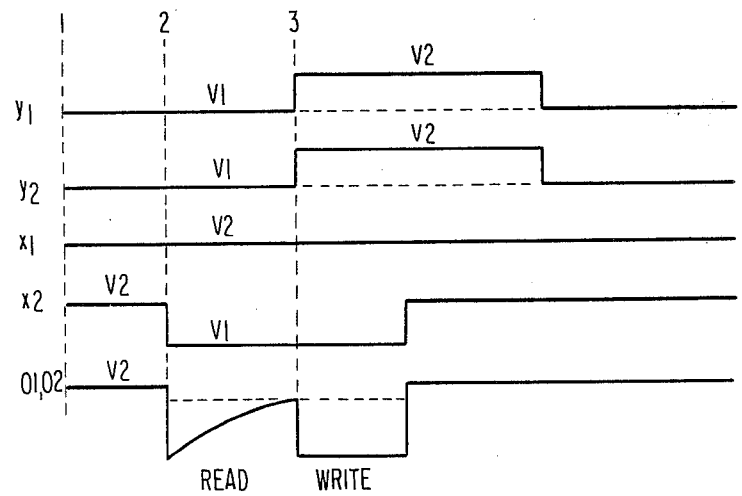
FIG. 4 is a timing diagram showing the operation of the device.

Consider now the operation of the array of FIG. 3. Initially, lines $y_1$ and $y_2$ are held at a low level $v1$ shown in the timing diagram of FIG. 4. Lines $x_1$ and $x_2$ are initially held at the high level ($v2$). The Schottky Barrier Diodes (SBD) for the cell have a zero applied bias since $v2$ is applied to both sides of the SBD. Accordingly, there is no current flow and the outputs $O_1$ and $O_2$ are at the same high level, $v2$. This is shown in FIG. 4 at point 1. The variable resistor values of each of the cells are therefore either at the high state, that is, no charge stored, or at a low state, where minority carrier charges have been stored.

The cycle begins with a read operation shown as point 2 in FIG. 4. The operation will be discussed for devices 21 and 22 since simultaneous read out occurs. Line $x_2$ falls to a low potential ($v1$) and current flows into devices 21 and 22 but not into devices 11 and 12 since $x1$ is at the high level $v2$. The magnitude of the current is determined by the charge stored in devices 21 and 22 in the previous cycle. If no charge has been stored in device 21, the current has a low value and the output $O_1$ falls by a small amount as indicated by the dotted line in FIG. 4. Also, $O_2$ falls by a small amount if no charge had been stored in device 22.

If a charge has been stored in device 21 or 22 a larger current will flow and the output $O_1$ or $O_2$ falls to a lower level indicated by the solid line in FIG. 4. As the current flows through device 21 or 22, the stored charge is removed, the resistance increases and the current decays to a low value. The output rises to the level shown by the dotted line. A sense amplifier, not shown, is connected to output lines $O_1$ and $O_2$ to distinguish between the solid and dotted line waveforms of that output. Because the read operation as described removes stored charge, it becomes necessary to rewrite stored charge if such has been sensed. It is apparent that the read operation occurs simultaneously for device 22.

To write stored charge into device 21, line $y_1$ is raised to the high level ($v2$) as shown as point 3 in FIG. 4. This high level $v2$ is shown as the solid line for $y_1$ in FIG. 4. This is accomplished if charge has been sensed in the subsequent read operation and if it is desired to restore the old data. Accordingly, if restoration is desired, and if the old data was not a stored charge, then, line $y_1$ is held at the low level ($v1$). If new data is to be written, independent of any old data, $y1$ is raised to the level $v2$ to store charge or held at level $v1$ for no stored charge to take place. Device 22 is written simultaneously with device 21 but independently under the control of line $y_2$.

Cells 11 and 12 are not disturbed during the read or write operations on devices 21 and 22 because the Schottky Barrier Diodes for those cells have not been forward biased, since $x_1$ was held at the high level $v2$ during the read and write operations described above. Devices 11 and 12 are selected for read and write operations by lowering the voltage of line $x_1$ while holding line $x_2$ at a high value.

While the operation of the memory array shown in FIG. 3 has been explained in terms of four memory cells arranged in a 2×2 matrix, it is apparent that for practical applications, a much larger array, typically 64K bits, of devices (N×N) by a 256×256 array of devices would be employed to store N×N bits. Also, the array need not be symm. For example, 256×512 (N×M) array can be used to form a 128K bit memory. The essential operation would, however, be identical.

It is apparent, therefore, from this description that the N+ reach through region 22 functions to separate the N− epi into two discrete regions 40 and 50 for the purpose of containing the stored charge within the region 40. This prevents the loss of stored charge during the data retention period and without N+ barrier 22 a loss would occur because of diffusion of minority carriers to the depletion region of the Schottky Barrier Diode. The present invention offers a significant improvement over the prior art by the elimination of the discrete external diode for each cell by the replacement of a SBD contact depletion region.

It is apparent that modifications and variations of this invention may be practiced without departing from the essential scope of this invention. For example, the injector and source regions may be reversed. The resistivity of region 50 could be altered by different dopings to increase is conductivity. This would be accomplished by ion implantation.

Reach through region 22 can be replaced by a recessed oxide (ROI) or other insulator so long as the N+ region 20 retains its continuity.

We claim:

1. A dynamic semiconductor memory cell comprising:
   a substrate;
   a first layer of one conductivity type formed on said substrate;
   a second layer of said one conductivity type formed on said first layer, said second layer lightly doped with respect to said first layer;
   means to divide said second layer into two separated areas;
   an injector region formed on the surface of said second layer in one of said separated areas of a doped opposite conductivity type, said injector region including a heavily doped zone of said one conductivity type surrounding said opposite conductivity type within said second layer;
   a source region formed in one of said two separated areas containing said injector region; and
   a drain region formed in the other of said separated areas by a low barrier Schottky contact with said second layer.

2. A dynamic storage device comprising:
   a substrate;
   a first layer of one conductivity type formed on said substrate;
   a second layer of one conductivity type formed on said first layer, said second layer lightly doped with respect to said first layer;
   means to divide said second layer into two separated areas, deep dielectric isolation regions formed through said first and second layers and extending to said substrate defining a plurality of memory cell areas;
   an injector region in each memory cell area formed on the surface of said second layer of a doped opposite conductivity type, said injector region including a zone of heavily doped zone of said one conductivity type surrounding said opposite conductivity type within said second layer;
   a source region formed in each memory cell in one of said two separated areas containing said injector region;
   a drain region formed in each memory cell in the other of said two separated areas and comprising a low barrier Schottky contact with said second layer, and metal lines.

3. The apparatus of claims 1 or 2 wherein said means to divide said second layer comprises a heavily doped region of said one conductivity type extending from the surface of said second layer to said first layer.

4. The apparatus of claims 1 or 2 wherein said means to divide said second layer comprises a recessed oxide insulator extending from the surface of said second layer to said first layer.

5. The apparatus of claims 1 or 2 wherein said low barrier Schottky contact comprises a metal contact selected from the group consisting of titanium, tungsten, an alloy of titanium and tungsten, chromium, tantalum or other metals having a barrier height on N− type silicon of less than about 0.55 electron volt.

6. The apparatus of claims 1 or 2 wherein said one conductivity type is N type silicon.

7. The apparatus of claims 1 or 2 further comprising an insulating oxide coating over said second layer.

8. The apparatus of claims 1 or 2 wherein said injector region comprised a boron P+ implant surrounded by a heavily doped N+ silicon zone.

9. The apparatus of claims 1 or 2 wherein the resistivity of said separated areas is different.

10. The apparatus of claims 1 or 2 wherein said injector region is positioned between said source and drain regions.

11. The apparatus of claim 2 wherein said memory cell areas define an array of M×N memory cells.

12. The apparatus of claim 11 wherein M=N.

* * * * *